(12) United States Patent
Yang

(10) Patent No.: US 7,564,335 B1
(45) Date of Patent: Jul. 21, 2009

(54) TRANSFORMER HOOK MOUNT

(76) Inventor: Kevin Yang, 1225 Via Coronel, Palos Verdes Est., CA (US) 90274

( * ) Notice: Subject to any disclaimer, the term of this patent is extended or adjusted under 35 U.S.C. 154(b) by 0 days.

(21) Appl. No.: 12/080,875

(22) Filed: Apr. 7, 2008

(51) Int. Cl.
    *H01F 27/29* (2006.01)
(52) U.S. Cl. .................................... 336/192
(58) Field of Classification Search ............... 336/65, 336/192, 198, 200, 232
    See application file for complete search history.

(56) References Cited

U.S. PATENT DOCUMENTS

| | | | |
|---|---|---|---|
| 5,165,056 A * | 11/1992 | Chien-heng | 336/65 |
| 5,896,077 A * | 4/1999 | Cadwallader | 336/192 |
| 6,069,550 A * | 5/2000 | Huang | 336/192 |
| 6,441,714 B2 * | 8/2002 | Maeda | 336/198 |
| 7,154,365 B2 * | 12/2006 | Park | 336/198 |
| 2002/0057029 A1 * | 5/2002 | Kataja | 310/194 |

\* cited by examiner

*Primary Examiner*—Tuyen Nguyen
(74) *Attorney, Agent, or Firm*—Clement Cheng

(57) ABSTRACT

A transformer comprises a core formed by laminations, each having a rectangular plate with two spaced windows for receiving a set of coils passing through the windows in turn; a dielectric bobbin threading the windows, the coils being wound over the bobbin passing through the windows in turn to form primary and secondary windings, each of the coil ends having connection pins arranged in at least two arrays, a pair of pin supports formed integral to the bobbin to span the width of the transformer and carry the arrays of connection pins, the supports extending through the core laminations down to the bottom thereof and terminating by flat bottoms resting upon the circuit board, and outwardly bent sections of the connection pins in one of the arrays to hook the circuit board at its thru holes making instantly a secure provisional joint with the trace of the circuit board.

5 Claims, 2 Drawing Sheets

TRANSFORMER HOOK MOUNT

BACKGROUND OF THE INVENTION

A. Field of the Invention

The present invention relates to transformer mounting. More particularly, the present invention relates to a transformer having a row of side hooking leads for improved mounting on printed circuit boards.

B. Description of the Prior Art

A transformer comprises two separate windings into a primary coil of wire and a secondary coil, a laminated bobbin or core for holding the windings to concentrate magnetic flux. An alternating voltage (AC) applied to one winding creates a time-varying magnetic flux in the core, which induces a voltage in the other windings. Varying the relative number of turns between primary and secondary coil windings determines the ratio of the input and output voltages, thus transforming the voltage by stepping it up or down between circuits.

The transformer transforms electrical current received from a primary coil side of circuit into a magnetic flux, which is transferred in a different current through the core to a secondary coil side of circuit ideally without any movement between the transformer parts. Its purpose is to change the electricity into a desired value wherein between the change of voltage and the corresponding change of the current ampere the voltage change is mainly used.

Electrical connections between the transformer coils and the surrounding circuit components are made by a plurality of pin leads tapped from various points of the windings.

When the transformer is used to power in a power circuit, the power transformer is primarily desired to function better for the simple and sophisticated operation of higher end device circuitries. For example, audio devices need signal flowing through a pure and simple path as well as a stable clean DC as in illuminating devices. To this end, transformers use the laminated metal core. Metal cores easily create magnetic flux and increases effectiveness of the transformer. Most metal cores are made from silicon steel sheets for their superior electrical properties in creating the magnetic flux with ease. Also as a measure to reduce Foucault current or Eddie current layers of 0.3 mm thin metal plates form the core. The superimposed surfaces of the metal layers are insulated from each other and carefully bonded together avoiding any gaps to deteriorate efficiency. Unfortunately, the current method of mounting is somewhat loose and fails after a few years. Having a through hole mounting prolongs the life span of the mounting, but substantially increases cost as well.

SUMMARY OF THE INVENTION

An objective of the present invention is to provide improved transformer pin leads for accelerating the assembly with a PCB (printed circuit board) in a mass production scale. In short, the present invention incorporates a hook shape into a bottom row of primary pin leads to permit a positive gripping onto the PCB whereby the transformer can be temporarily secured before entering a soldering process. Inserting the hook ends of the primary pin leads of the transformer of the present invention is as simple as an oblique lateral mounting of the transformer with respect to the PCB and a slight pivoting drop of the rest into the prepared thru hole on the PCB.

This assembly method is advantageously quick and secure over conventional method with straight pin leads.

The present invention is an improvement to conventional transformer having arrays of pin leads for mounting on printed circuit boards. The transformer comprises a core formed from portions of ferrite core material and having two parallel front and rear sides and two parallel lateral sides, coils passing around the core; a dielectric bobbin having a cylindrical body for holding the coils within the premise of the core, two lateral side legs formed integral to the cylindrical body to extend substantially along the lateral sides of the core respectively for supporting the transformer on the printed circuit board, and electrical terminals mounted on the legs for holding ends of the coils and electrically leading the coil ends to the circuit board and including a row of vertical primary pin leads for penetrating the circuit board at thru holes formed therein to secure the transformer and a row of longitudinal primary terminal pins extending from the primary pin leads in one of the side legs and a row of vertical secondary pin leads for penetrating the circuit board and a row of longitudinal secondary terminal pins extending from the secondary pin leads in the remaining side leg.

The objects, features, and advantages of the present invention are readily apparent from the following detailed description of the best mode for carrying out the invention when taken in connection with the accompanying drawings.

BRIEF DESCRIPTION OF THE DRAWINGS

Similar reference numbers denote corresponding features throughout the attached drawings.

| | |
|---|---|
| 10: Transformer | 11: Copper Wire |
| 12: Core | 14: Bobbin |
| 16, 17: Supporting Leg | 18: Primary Pin Lead |
| 20: Primary Terminal Pin | 22: Coil End |
| 24: Hook | 26: Clearance |
| 28: Secondary Pin Lead | 30: Secondary Terminal Pin |
| 32: Clearance | 34, 36: Thru-hole |
| 38, 40: Solder | |

DETAILED DESCRIPTION OF THE PREFERRED EMBODIMENT

Figure 1:
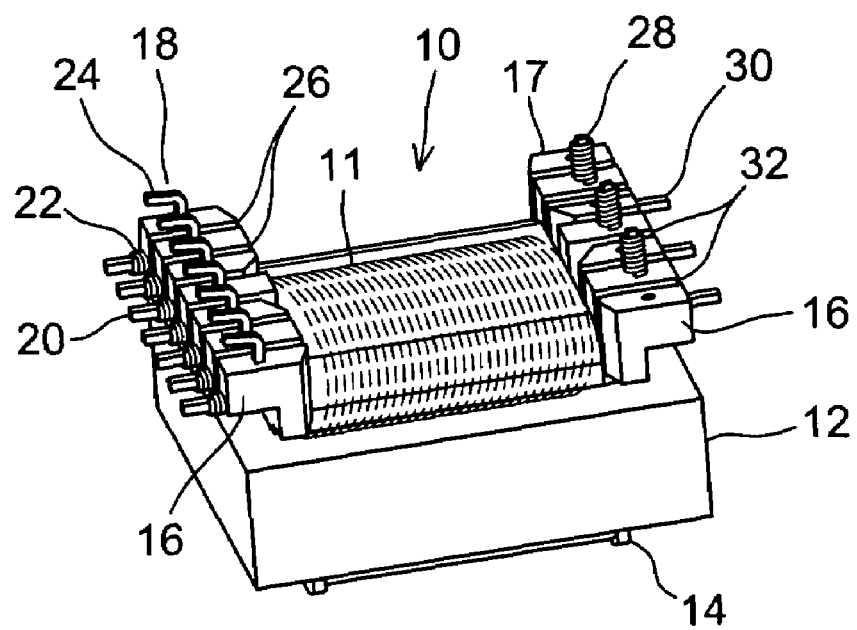
FIG. 1 is a perspective view of a transformer with fast mount in-line leads in accordance with a preferred embodiment of the present invention.

Referring to FIG. 1, a transformer 10 of the present invention is shown upside down to reveal its bottom rows of connectors to a printed circuit board. Transformer 10 has a core 12 that may be made of high permeability silicon steel. The core 12 is conventionally made of multiple steel layers stacked alternately with dielectric layers in a longitudinal direction or can be made of one or more blocks or sections of ferrite core material. The ferrite core material can be made by ceramic production methods. Like most small power transformers, the transformer 10 is shell-type, in which the iron core 12 surrounds copper wires 11, which have been wound about a dielectric bobbin 14, which may be molded from plastic. The ideal would be for the core iron to completely surround the windings, although this is impractical. The compromise is to divide the magnetic circuit into two return paths on opposite sides of the core, as may be done with E and E laminations where the center legs of "E" extend into a cylindrical body of bobbin 14.

When the transformer 10 is used to power in a power circuit, the power transformer is primarily desired to function better for the simple and sophisticated operation of higher end device circuitries. For example, audio devices need signal flowing through a pure and simple path as well as a stable clean DC as in illuminating devices. To this end, transformers use the laminated metal core. Metal cores easily create magnetic flux and increases effectiveness of the transformer. Most metal cores are made from silicon steel sheets for their superior electrical properties in creating the magnetic flux with ease. Also as a measure to reduce Foucault current or Eddie current layers of 0.3 mm thin metal plates form the core 12. The superimposed surfaces of the metal layers are insulated from each other and carefully bonded together avoiding any gaps to deteriorate efficiency.

As to the lamination pattern, the common E and I shapes may be also employed. So, the core 12 may have a parting line (not shown) through the thickness at its middle or close to one of two supporting legs 16 and 17. As the E and E laminations are bonded together, the core 12 is tightly held by the plastic bobbin 14 holding the windings 11. Alternatively, the core 12 can also be made of one or more sections of ferrite core material similarly bonded together and tightly held by the plastic bobbin 14 holding the windings 16. The laminations are glued together by the insulating substance or the ferrite core material is glued or taped or otherwise adhered together. The windings on this transformer are wound one over the other, the primary winding may be first wound on the bobbin 14 followed by the secondary winding on top of the primary winding maintaining electrical isolation at each and every turns of the copper wires. The ends of the wires 11 are soldered to multiple terminal pin leads 24 and 28. The turns of the windings 11 must be insulated from each other to ensure that the current travels through the entire winding. The potential difference between adjacent turns is usually small, so that enamel insulation may suffice for small power transformers.

Besides the core shapes like the E-E core or E-I core, the present invention also applies to different core geometries like a round bobbin core or pot core. Varying the geometries of transformer core will offer trade-off among energy storage, field emission, and ease of assembly of the transformer. In case the core 12 is of E-E type, it can be divided at a straight middle line by two E shaped core sections joined facing opposite to each other in the lateral direction of the drawing with the center legs of E sections extending toward the center of transformer 10 on which a cylindrical body (not shown) of a conventional plastic bobbin 14 sleeves. As is known in the art, the bobbin 14 takes a secondary and then primary coil windings with dielectric tapes in between. Integrally formed to the bobbin cylinder, two opposite legs 16, 17 support the core 12 as well as conductive pin leads to be connected to a printed circuit board (PCB in FIG. 2).

Pin leads may be formed buried inside legs 16, 17 and comprise a row of primary hook leads 18 extending from the bottom surface of transformer 10 and an auxiliary row of primary terminal pins 20, which branch from buried proximal ends of primary leads 18 laterally outwardly of transformer 10. To primary terminal pins 20 ends 22 of the primary coil windings may be wound. There are shown seven primary leads 18 bent near the distal ends of primary leads 18 to form hooks 24 that double as conductive terminals. To ensure electric isolation between neighboring leads 18, lateral clearances 26 are formed therebetween.

At the opposite side of transformer 10, the other leg 17 may hold a row of three secondary pin leads 28 protruding from the bottom surface of leg 17. Extending laterally from the proximal ends of secondary pin leads 28 are secondary terminal pins 30 for connection with associated components on the PCB. Also formed between the respective pairs of secondary pin leads 28 and terminal pins 30 are lateral clearances 32 to ensure electric isolations.

The hook formation may be alternatively applied the secondary pin leads. In FIG. 1, the hooked pin leads 18 may be designated to connect with the secondary windings while the pin leads 28 to connect with the primary windings to obtain the equally improved mounting efficiency of the present invention.

Figure 2:
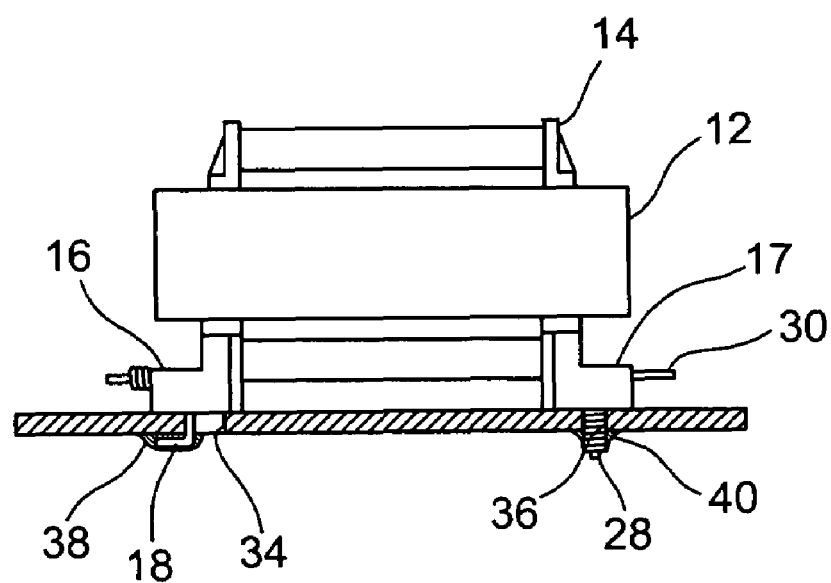
FIG. 2 is a side elevational view of the transformer of FIG. 1 mounted on a circuit board.

FIG. 2 shows the upright position of transformer 10 mounted on the PCB depicted in cross section. PCB holds primary and secondary pin leads 18 and 28 at its thru holes 34 and 36, respectively. The distal ends of the primary pin leads 18 are located immediately within peripheral edges of the core 12 for an assembler to align the leads 18 with the holes 34 without needing a careful visual or optical inspection. Secondary pin lead 28 is fixed to the PCB by a bead of solder 38. Primary pin lead 18 is clearly shown to hook the bottom surface of the PCB to further secure the position of transformer 10 even before solder 40 is formed around lead 28. Moreover, the principal advantage of the present invention is in the accelerated process of mounting transformer 10 on the PCB.

This is clearly illustrated in FIGS. 3A through 3E each showing the steps of installing the transformer 10 in a quick combined downward and lateral mounting motions by either a human hand or a controlled machine actuator. Chronologically speaking, FIGS. 3A through 3E show a moment by moment mounting of the transformer 10.

Figure 3A:
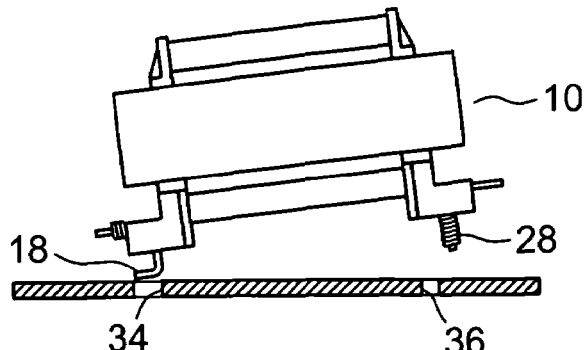
FIG. 3A is a partially sectional side elevational view of the transformer at an initial drop with respect to matching thru holes of a circuit board in position 1.
Figure 3B:
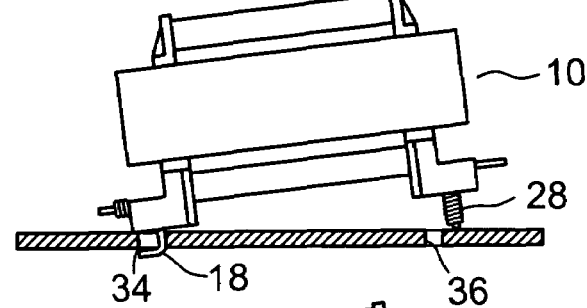
FIG. 3B is a side elevational view of the transformer at a one-sided penetration of the thru holes in position 2.
Figure 3C:
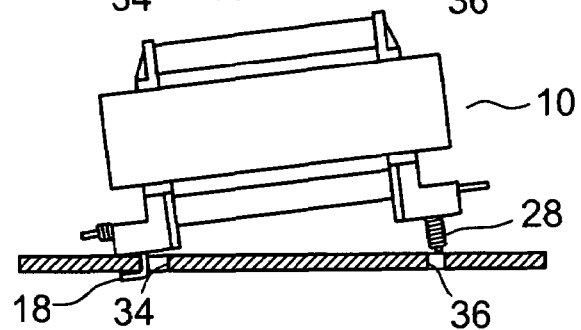
FIG. 3C is a side elevational view of the transformer after a lateral shift to hook the circuit board around the thru holes in position 3.
Figure 3D:
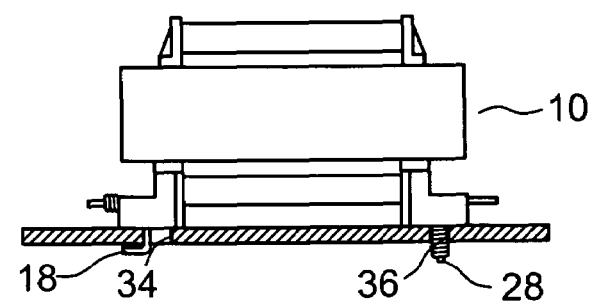
FIG. 3D is a side elevational view of the transformer at another side penetration of the thru holes in position 4.
Figure 3E:
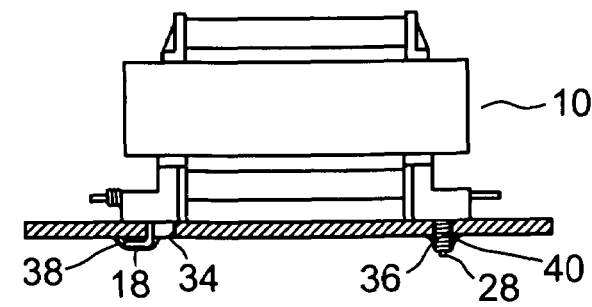
FIG. 3E is a side elevational view of the transformer with both in-line leads soldered to the circuit board in final position 5.

In FIG. 3A, transformer 10 is first brought to the PCB in a slanted posture so that primary pin leads 18 are pointing the corresponding thru holes 34 each having a dimension just to allow unobstructed passage of the hook 24 of primary lead 18 therethrough. At this posture, secondary pin leads 28 are above the PCB and slightly deviated from thru holes 36. The main body of transformer 10 in FIG. 3B is in touch with the PCB, and primary pin leads 18 have passed the hole 34 to protrude from the other side of PCB. Next in FIG. 3C, primary leads 18 are shifted to their side to hook the underside of the PCB and align the secondary leads 28 just above the hole 36. At this moment, no more actuation energy is necessary because transformer 10 may automatically fall into hole 36 under gravity. Transformer 10 in FIG. 3D assumes the final mounting posture with both rows of leads 18 and 28 protruding from the bottom of PCB and is ready to apply solder as at 38 and 40 in FIG. 3E. Due to the branched rows of primary and secondary leads 20, 30, primary and secondary pin leads 24, 28 may be exclusively used to support the respective legs 16 and 20 and thus transformer 10 although they can keep serving as connecting terminals.

So, longitudinally outwardly extending hooks formed of bent sections in a row of the primary or secondary pin leads make a positive locking joint through an oblique sidewise drop of the transformer terminals into the thru hole of the circuit board in preparation for making a permanent soldering joint between the transformer and circuit board.

With the new built-in mounting assist of hook forms 24 in the pin leads 18, the present invention provides a faster and accurate transformer 10 to assemble over conventional plain lead transformers. The present invention primarily details transformer mounting, but can also be adapted to teach mounting of a wide variety of electronic components.

Therefore, while the presently preferred form of transformer with hook leads has been shown and described, it is to be understood that the present invention is not limited to the sole embodiment describe above, but encompasses any and all embodiments within the scope of the following claims. It would be obvious to use the invention for other electrical components besides transformer mounting.

The invention claimed is:

1. A transformer mounting on a longitudinal surface of a printed circuit board, wherein the transformer comprises a core formed from portions of ferrite core material and having two parallel front and rear sides and two parallel lateral sides, coils passing around the core; a dielectric bobbin having a cylindrical body for holding the coils within the premise of the core, two lateral side legs formed integral to the cylindrical body to extend substantially along the lateral sides of the core respectively for supporting the transformer on the printed circuit board, and electrical terminals mounted on the legs for holding ends of the coils and electrically leading the coil ends to the circuit board and including a row of vertical primary pin leads for penetrating the circuit board at thru holes formed therein to secure the transformer and a row of longitudinal primary terminal pins extending from the primary pin leads in one of the side legs and a row of vertical secondary pin leads for penetrating the circuit board and a row of longitudinal secondary terminal pins extending from the secondary pin leads in the remaining side leg, an improvement comprising:

a. longitudinally outwardly extending hooks formed of bent sections in one of the rows of the primary and secondary pin leads;
   b. a positive locking joint through an oblique sidewise drop of the transformer terminals into the thru hole of the circuit board;
   c. a solder joint between the transformer and circuit board.

2. The transformer mounting of claim 1, wherein distal ends of the primary pin leads are located immediately within peripheral edges of the core.

3. The transformer of claim 1, wherein the primary and secondary pin leads are directly soldered to the printed circuit board for providing connections with associated electronic components of a circuit designed on the circuit board.

4. A transformer mounting comprising:

a. a circuit board having a row of slot shaped through holes opposite a row of holes;
   b. a transformer having a row of primary pin leads and a row of secondary pin leads:
   c. connections with a number of electronic components mounted on the circuit board with a predetermined number of mounting thru holes and circuit traces, wherein the connections electrically connect the transformer to the circuit board and other number of electronic components; and
   d. outwardly bent sections of the primary pin leads for providing a hook connection between the transformer and the circuit board at the row of slot shaped through holes at a first set of soldered connections, wherein the row of secondary pin leads are wrapped in wire and pass through the rule of holes at a second set of soldered connections.

5. The transformer mounting of claim 4, wherein a pair of pin supports made of dielectric material for supporting pin arrays extending downwardly thereof, the supports being formed integral to the opposite ends of the bobbin and extending through core laminations and terminating by flat bottoms resting upon the circuit board.

* * * * *